United States Patent [19]
Yoshinouchi

[11] Patent Number: 5,767,531
[45] Date of Patent: Jun. 16, 1998

[54] THIN-FILM TRANSISTOR, METHOD OF FABRICATING THE SAME, AND LIQUID-CRYSTAL DISPLAY APPARATUS

[75] Inventor: Atsushi Yoshinouchi, Kashiba, Japan

[73] Assignee: Sharp Kabushiki Kaisha, Osaka, Japan

[21] Appl. No.: 946,408

[22] Filed: Oct. 7, 1997

Related U.S. Application Data

[63] Continuation of Ser. No. 459,305, Jun. 2, 1995, abandoned.

[30] Foreign Application Priority Data

Aug. 29, 1994 [JP] Japan .................... 6-203588

[51] Int. Cl.$^6$ .................... H01L 29/04; H01L 31/0368; H01L 29/786
[52] U.S. Cl. .................... 257/72; 257/66; 257/408; 349/46
[58] Field of Search .................... 257/57, 59, 66, 257/72, 351, 69, 408; 349/46

[56] References Cited

U.S. PATENT DOCUMENTS

| | | | |
|---|---|---|---|
| 3,436,620 | 4/1969 | Diemer et al. | 257/66 |
| 3,436,623 | 4/1969 | Beer | 257/66 |
| 4,822,751 | 4/1989 | Ishizu et al. | 257/72 |
| 4,876,582 | 10/1989 | Janning | 257/66 |
| 5,403,756 | 4/1995 | Yoshinouchi et al. | 437/24 |
| 5,504,347 | 4/1996 | Jovanovic et al. | 257/25 |

FOREIGN PATENT DOCUMENTS

| | | | |
|---|---|---|---|
| 2-230773 | 9/1990 | Japan | 257/57 |
| 3-34669 | 5/1991 | Japan . | |
| 3-38755 | 6/1991 | Japan . | |
| 3-293771 | 12/1991 | Japan | 257/66 |
| 4-32264 | 2/1992 | Japan | 257/66 |
| 4-313274 | 11/1992 | Japan | 257/57 |
| 4-365380 | 12/1992 | Japan | 257/66 |
| 5-44195 | 7/1993 | Japan . | |
| 5-44196 | 7/1993 | Japan . | |

OTHER PUBLICATIONS

Catalano, et al, PCT Published Application No. WO 89/09494, Oct., 1989.
J. G. Fossum "Anomalous Leakage Current in LPCVD Polysilicon MOSFET's", *IEEE, Transactions on Election Devices*, vol. ED-32, No. 9, Sep. 1995, pp. 1878-1885.

*Primary Examiner*—Jerome Jackson
*Assistant Examiner*—John Guay
*Attorney, Agent, or Firm*—David G. Conlin; George W. Neuner

[57] ABSTRACT

A thin-film transistor includes a semiconductor layer having a source region and a drain region, a gate insulating film formed on the semiconductor layer, and a gate electrode formed on the gate insulating film, wherein a portion of the gate insulating film disposed above a portion of the semiconductor layer sandwiched by the source region and the drain region includes of a first portion with a first thickness and a second portion with a second thickness which is different from the first thickness.

15 Claims, 12 Drawing Sheets

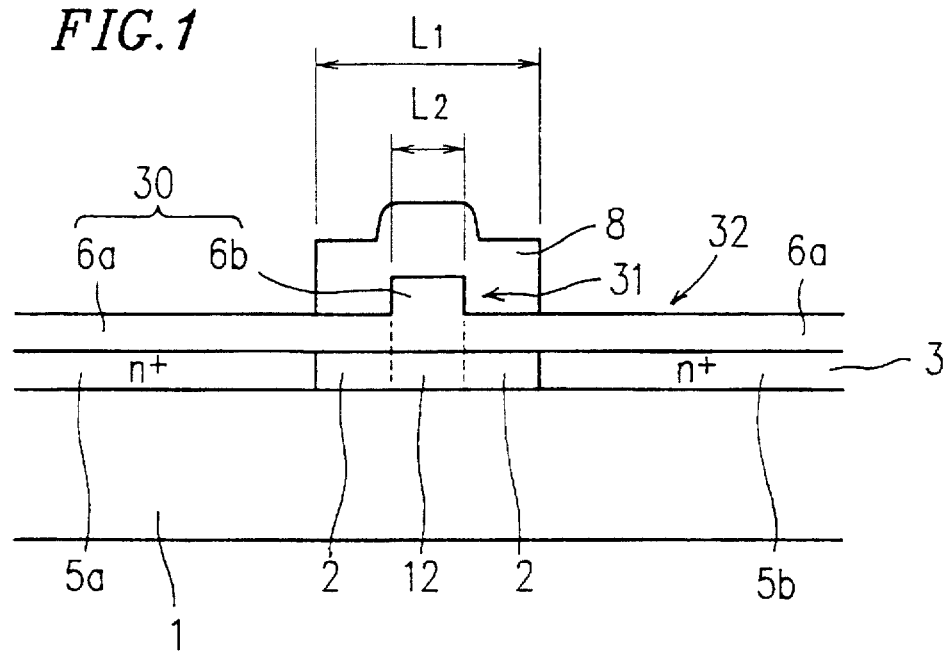

5,767,531

THIN-FILM TRANSISTOR, METHOD OF FABRICATING THE SAME, AND LIQUID-CRYSTAL DISPLAY APPARATUS

This application is a continuation of application Ser. No. 08/459,305 filed on Jun. 2, 1995, now abandoned.

BACKGROUND OF THE INVENTION

1. Field of the Invention

The present invention relates to a thin-film transistor suitable for use in a display device apparatus such as an active-matrix liquid-crystal display apparatus, a method of fabricating such a thin-film transistor, and a liquid-crystal display apparatus having such a thin-film transistors.

2. Description of the Related Art

In recent years, it has been practice to integrate external driving circuits for a display apparatus such as a liquid-crystal display apparatus or an image sensor onto the same substrate as the display apparatus, image sensor, etc. This trend has increased the need to fabricate thin-film transistors (hereinafter referred to as TFTs) on a transparent insulating substrate. To achieve this, fabrication of TFTs must be performed at 600° C. or lower process temperatures to permit the use of a glass substrate having a large-area.

Generally, TFT characteristics are greatly influenced by the condition of a semiconductor film that acts as the channel and the condition of the interface between a semiconductor film and a gate insulating film; the characteristics tending to improve with increasing process temperatures. It is therefore difficult to obtain good characteristics at the 600° C. or lower process temperatures described above. In particular, when using TFTs for pixels in an active-matrix liquid-crystal display apparatus, the off current under reverse bias conditions need to be minimized, but it is difficult to reduce the off current satisfactorily with conventional TFT structures.

A model for explaining this has been presented according to which the depletion region is narrow at the end of the heavily doped drain region, resulting in the concentration of a high electric field and thus causing current to flow via crystal defect states of poly-Si in the depletion region (IEEE TRANSACTIONS ON ELECTRON DEVICES, VOL. ED-32, NO.9, SEPTEMBER 1985).

The following three structures are known as specific examples for solving the above problem. One is the offset-gate structure shown in FIG. 15, which is disclosed in Japanese Patent Publication No. 3-34669. Another is the LDD (lightly doped drain) structure shown in FIG. 16, which is disclosed in Japanese Patent Publication No. 3-38755. The other is the dual-gate structure (or multi-gate structure) shown in FIG. 17, which is disclosed in Japanese Patent Publication No. 5-44196. With these structures, the electric field applied at the end portion of the drain region is eased and the off current is reduced.

In the offset-gate structure of FIG. 15, a semiconductor layer is formed on a substrate 101, and a gate electrode 108 is formed on a gate insulating film 107 formed over the semiconductor layer. The portion of the semiconductor layer that lies vertically beneath the gate electrode 108 is formed as an active layer 102 that provides the channel of the TFT and is sandwiched by non-doped offset regions 103 outside of which are formed heavily doped, low-resistance source/drain regions 105.

In the LDD structure of FIG. 16, a semiconductor layer is formed on a substrate 101, and a gate electrode 108 is formed on a gate insulating film 107 formed over the semiconductor layer. The portion of the semiconductor layer that lies vertically beneath the gate electrode 108 is formed as an active layer 102 that provides the channel of the TFT and is sandwiched by lightly doped LDD regions 104 outside of which are formed heavily doped, low-resistance source/drain regions 105.

In the dual-gate structure of FIG. 17, a semiconductor layer is formed on a substrate 101, and two gate electrodes 108 are formed on a gate insulating film 107 formed over the semiconductor layer. The portions of the semiconductor layer that lie vertically beneath the two gate electrodes 108 are formed as active regions 102 that provide the channel of the TFT, the other portions of the semiconductor layer being formed as heavily doped, low-resistance source/drain regions 105.

However, the above three structures have the following problems. A problem with the offset-gate structure is that if the offset length $L_{off}$, that is, the length of the offset region 103 shown in FIG. 15, is increased. This causes not only the off current but the on current also drastically to decrease. Thus, variations in the length $L_{off}$ cause large variations in the device characteristics.

Furthermore, it is required to form non-doped regions as the offset regions 103, but the process for forming such non-doped regions may involve alignment errors. That is, a mask is usually formed by photolithography using a photoresist or by etching an insulating film. In either way, however, since the mask is not formed in self alignment with the source and drain regions, alignment errors are introduced. This causes variations in the TFT characteristics.

On the other hand, if the mask is to be formed in self-aligned fashion, it is necessary to form an insulating film as a sidewall on vertical surfaces of the gate electrode. This reduces the fabrication yield and increases the production cost. The reason is that the formation of the sidewall requires additional processing steps, i.e., a film deposition step for forming the insulating film and an etching step for anisotropically etching the insulating film to form the sidewall. Furthermore, when the sidewall is used, the offset length $L_{off}$ is approximately equal to the thickness of the deposited insulating film, usually about 300 to 500 nm, which may not be sufficient to obtain a satisfactory off-current reduction effect. Moreover, in a TFT of the offset-gate structure, since variations in the resistivity of the active layer in the offset regions 103 result in variations in the device characteristics, the reliability of the TFT is low and characteristic degradation may often result.

The LDD structure provides good reliability, but has similar problems to those of the above-described offset structure since masking is needed during the fabrication process. Furthermore, this structure has the problem of increasing the complexity of processing because it requires an extra step of doping to form the lightly doped LDD regions 104.

The dual-gate structure has the problem of being unable to reduce the off current sufficiently although it can achieve a reduction to a certain extent.

The present invention can solve the above enumerated problems associated with the conventional art, and provides a thin-film transistor having reduced off current and increased reliability, a thin-film transistor fabrication method capable of fabricating such a thin-film transistor without increasing the complexity of the fabrication process, and a liquid-crystal display constructed with such thin-film transistors and having high display quality and reliability.

SUMMARY OF THE INVENTION

The thin-film transistor of the invention includes a semiconductor layer having a source region and a drain region, a gate insulating film formed on the semiconductor layer, and a gate electrode formed on the gate insulating film, wherein a portion of the gate insulating film disposed above a portion of the semiconductor layer sandwiched by the source region and the drain region includes a first portion with a first thickness and a second portion with a second thickness which is different from the first thickness.

In one embodiment of the invention, the second portion is 1.2 to 8.0 times as thick as the first portion.

In another embodiment of the invention, the second portion is constructed in a multilayer structure consisting of an insulating film having the first thickness and an insulating film having a thickness 0.2 to 7.0 times the first thickness.

According to another aspect of the invention, a method of fabricating a thin-film transistor is disclosed. The method includes the steps of: forming a semiconductor layer on a substrate; forming a gate insulating film on the semiconductor substrate, the gate insulating film having a first portion with a first thickness and a second portion with a second thickness which is different from the first thickness; forming a gate electrode on the gate insulating film such that at least part of the second portion is covered with the gate electrode; and implanting impurity ions into the semiconductor layer using the gate electrode as a mask, to form a source region and a drain region in the semiconductor layer.

In one embodiment of the invention, the step of forming the gate insulating film, includes the steps of: forming a first insulating layer in an island shape on the semiconductor layer; and forming a second insulating layer on the semiconductor layer and over the first insulating layer, wherein the second insulating layer is 0.2 to 7.0 times as thick as the first insulating layer.

In another embodiment of the invention, the step of forming the gate insulating film, includes the steps of: forming an insulating film having the second thickness on semiconductor layer; and etching a part of the insulating film which to be the first portion until the part of the insulating film has the first thickness.

According to still another aspect of the invention, a liquid-crystal display apparatus is disclosed. The liquid-crystal display apparatus includes a plurality of thin-film transistors, each thin-film transistor having a source region and a drain region, a gate insulating film formed on the semiconductor layer, and a gate electrode formed on the gate insulating film, wherein a portion of the gate insulating film disposed above a portion of the semiconductor layer sandwiched by the source region and the drain region consists of a first portion with a first thickness and a second portion with a second thickness which is different from the first thickness.

According to still another aspect of the invention, a thin-film transistor includes: a semiconductor layer having a source region and a drain region; a gate insulating film formed on the semiconductor layer, the gate insulating film including an insulating film having at least one ridge, the ridge being positioned above a portion of the semiconductor layer interposed between the source region and the drain region and extending along a first direction; and a gate electrode formed on the gate insulating film and extending along the first direction such that at least portion of the ridge is covered with the gate electrode.

In one embodiment of the invention, a thickness of the gate insulating film at the ridge is 1.2 to 8.0 times as great as that of a portion other than the ridge.

In another embodiment of the invention, the gate insulating film has one ridge beneath a middle of the gate electrode.

In still another embodiment of the invention, the gate insulating film has one ridge beneath a side face of the gate electrode.

In still another embodiment of the invention, a side face of the ridge is aligned with the side face of the gate electrode.

In still another embodiment of the invention, a portion of the ridge is covered over the gate electrode.

In still another embodiment of the invention, the semiconductor layer includes a region doped with impurities at a smaller concentration than that of the drain region, and the region is disposed beneath the other portion of the ridge.

In still another embodiment of the invention, the gate insulating film has two ridges beneath opposing side faces of the gate electrode, respectively.

In still another embodiment of the invention, side faces of the ridge is aligned with the corresponding side faces of the gate electrode, respectively.

In still another embodiment of the invention, a portion of each ridge is covered over the gate electrode.

In still another embodiment of the invention, the semiconductor layer includes two regions doped with impurities at a smaller concentration than that of the drain region, and each of the regions is disposed beneath the other portion of the corresponding ridge.

According to the invention, a gate insulating film lying between a gate electrode and a semiconductor layer having source and drain regions includes a first portion and a second portion respectively formed to different thicknesses on the region of the semiconductor layer sandwiched by the source and drain regions. As a result, a region relatively insensitive to an applied gate voltage is selectively formed in the channel region between the source and drain regions. With this selectively formed region, the voltage applied between the source and drain is prevented from concentrating on the drain end but is divided. Furthermore, since the electric field intensity is eased by this region, this region serves to suppress the occurrence of an abruptly increasing portion in the electric field applied between the source and drain. This reduces the off current in the reverse-biased side, and a TFT having little characteristic degradation can be obtained. For the maximum effect, it is desirable that the second film thickness be made 1.2 to 8.0 times the first film thickness.

In forming the gate insulating film having two different thickness portions as described above, the fabrication is greatly facilitated if the second portion is constructed in a multilayer structure by first forming an insulating film of the first thickness and then forming thereon an insulating film having a thickness 0.2 to 7.0 times the first thickness in a region where the second portion is to be formed. In this case, the insulating film having the first thickness and the insulating film having the thickness 0.2 to 7.0 times the first thickness may be formed in either order. With this method, it is possible to fabricate the TFT of this invention at a position where off current reduction is needed and the TFT of the prior art at a position where off current reduction is not needed, simultaneously on the same substrate.

In an alternative method, an insulating film of the second thickness is formed over the semiconductor layer, and etching is performed to reduce the thickness of the insulating film in a region where the first portion is to be formed. This also facilitates the fabrication. With this method also, it is possible to fabricate the TFT of this invention at a position where off current reduction is needed and the TFT of the prior art at a position where off current reduction is not needed, simultaneously on the same substrate.

When the TFT with the gate insulating film having two different thickness portions, as described above, is formed at each pixel site in a liquid-crystal display, the off current of the pixel TFT can be reduced, and the ability to retain a displayed image can be enhanced to improve the display quality. Furthermore, since this TFT has high reliability, the reliability of the liquid-crystal display can also be improved.

Thus, the invention described herein makes possible the advantages of (1) providing a thin-film transistor having reduced off current and increased reliability, (2) providing a thin-film transistor fabrication method capable of fabricating such a thinfilm transistor without increasing the complexity of the fabrication process, and (3) providing a liquid-crystal display apparatus constructed with such thin-film transistors and having high display quality and reliability.

These and other advantages of the present invention will become apparent to those skilled in the art upon reading and understanding the following detailed description with reference to the accompanying figures.

BRIEF DESCRIPTION OF THE DRAWINGS

FIG. 1 is a schematic cross-sectional view of a TFT according to a first embodiment of the present invention.

DESCRIPTION OF THE PREFERRED EMBODIMENTS

Figure 2A:
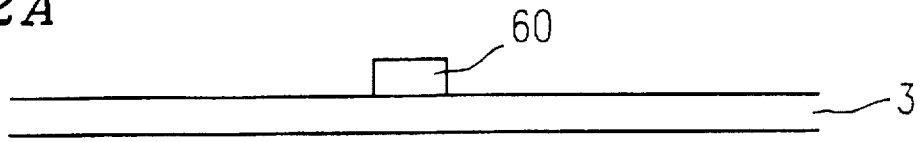
FIGS. 2A to 2C are cross-sectional views illustrating a fabrication process sequence for the TFT according to the first embodiment of the present invention.

The preferred embodiments of the present invention will be described below with reference to the accompanying drawings. Throughout the drawings given hereinafter, parts having the same or corresponding functions are designated by the same reference numerals.

(Embodiment 1)

FIG. 1 shows a schematic cross-sectional view of a TFT according to a first embodiment of the invention. In the TFT shown, a semiconductor layer 3 is formed on a substrate 1, and a gate insulating film 30 is formed on the semiconductor layer 3. A gate electrode 8 is further formed on the gate insulating film 30. The the gate insulating film 30 includes first portions 6a having a first thickness and a second portion 6b having a second thickness. the second portion 6b is located at the center portion directly under the gate electrode 8. The second thickness is 1.2 to 8.0 times as great as the first thickness.

The semiconductor layer 3 includes channel regions 12 and 2, a source region 5a, and a drain region 5b. The channel regions 12 and 2 are positioned vertically beneath the gate electrode 8, the channel region 12 is also positioned vertically beneath the second portion 6b. The channel region 12 is interposed between the channel regions 2 which are positioned beneath the first portions 6a. The channel regions 12 and 2 are interposed between the source region 5a and the drain region 5b which are heavily doped with impurities.

It is also explained that the gate insulating film 30 has a insulating film 32 having a ridge 31 thereon. The ridge 31 is positioned beneath the gate electrode 8 and elongates along the gate electrode 8, i.e., along the direction perpendicular to a channel length. The TFT of this structure can be fabricated in accordance with the fabrication process sequence shown in FIGS. 2A to 2C.

First, as shown in FIG. 2A, the semiconductor layer 3 is formed over the substrate 1. The substrate 1 is formed, for example, from a quartz substrate, a glass substrate, or a glass substrate coated with an insulating film. The semiconductor layer 3 is formed, for example, from a semiconductor film such as amorphous silicon, microcrystalline silicon, or polycrystalline silicon. When the substrate 1 is formed from single-crystalline silicon, it is not necessary to form the semiconductor layer 3, but the single-crystalline silicon substrate itself can be used as the semiconductor layer. Furthermore, the semiconductor layer may be formed from any of the above materials with germanium, nickel, phosphorus, boron, arsenic, etc. contained therein.

The semiconductor layer 3 can be formed by depositing a film of thickness 10 nm to 200 nm using a thin-film deposition process such as plasma CVD (chemical vapor deposition) or LPCVD (low-pressure CVD). For example, a polycrystalline silicon film can be deposited directly on the substrate by LPCVD with the substrate held at temperatures 580° to 650° C. Further, if an amorphous silicon film deposited by LPCVD, at substrate temperatures of 400° to 600° C., is annealed in vacuum or in an inert gas atmosphere at 500° to 650° C. for 6 to 48 hours, a polycrystalline silicon film with increased quality is obtained. An amorphous silicon film can also be formed by plasma CVD, using $SiH_4$ or $Si_2H_6$ as the source gas. Lamp annealing or laser annealing may be used to anneal the amorphous silicon film.

Next, an insulating film is deposited over the semiconductor layer 3, and etching is performed to form an insulting film island 60 extending along a first direction. The insulating film can be deposited by sputtering, atmospheric-pressure CVD, LPCVD, plasma CVD, remote plasma CVD, etc. In this embodiment, a $SiO_2$ film of thickness 30 to 150 nm is formed. Alternatively, the insulating film may be formed from silicon nitride, tantalum oxide, aluminum oxide, or the like.

Figure 2B:
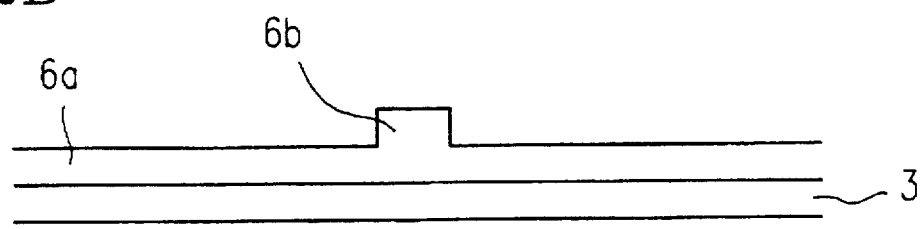

Next, as shown in FIG. 2B, an insulating film is deposited over the insulating film island 60, to form the first portion 6a and the second portion 6b having a greater film thickness than the first portion 6a. The formation of the insulating film in this case can be accomplished by a deposition process such as sputtering, atmospheric-pressure CVD, LPCVD, plasma CVD, or remote plasma CVD. In this embodiment, a $SiO_2$ film of thickness 60 to 150 nm is formed. A combination of $SiH_4$ gas and $O_2$ gas, or TEOS (tetra-ethyl-ortho-silicate, $Si(OC_2H_5)_4$) gas and $O_2$ gas, etc. is used as the source gas. The insulating film may also be formed from silicon nitride, tantalum oxide, aluminum oxide, or the like.

When the second portion 6b having the larger film thickness is formed in the above manner, the TFT of this embodiment and the TFT of the prior art can be fabricated very easily using the same fabrication process. For example, when fabricating the TFT of this embodiment and the TFT of the prior art on the same substrate, the insulating film island 60 having a film thickness 0.2 to 7.0 times as great as the first thickness is patterned and formed only where the second portion of the TFT of this embodiment is to be formed, and the insulating film having the first thickness is patterned and formed where the gate insulating film of the TFT of this embodiment and the gate insulating film of the TFT of the prior art are to be formed.

With this method of fabrication, since the TFT of this embodiment and the TFT of the prior art can be easily formed together on the same substrate, it is possible to form the TFT of this embodiment at a position where off current reduction is needed and the TFT of the prior art at a position where off current reduction is not needed. In this case, the insulating film having the first thickness and the insulating film having a film thickness 0.2 to 7.0 times as great as the first thickness may be formed in either order.

In the above description, the second portion is formed as a two-layered insulating film, but alternatively, the gate insulating film 30 having the first portion 6a and the second portion 6b may be formed by first forming an insulating film having the second thickness where the gate insulating film is to be formed, and then reducing the thickness of the insulating film by photolithography and etching in a region where the first portion is to be formed. In this case also, the TFT of this embodiment and the TFT of the prior art can be formed together on the same substrate by leaving the second-thickness insulating film unetched where the second portion of the TFT of this embodiment is to be formed and by etching the other portion where the first portion and the gate insulating film of the TFT of the prior art are to be formed.

Figure 2C:
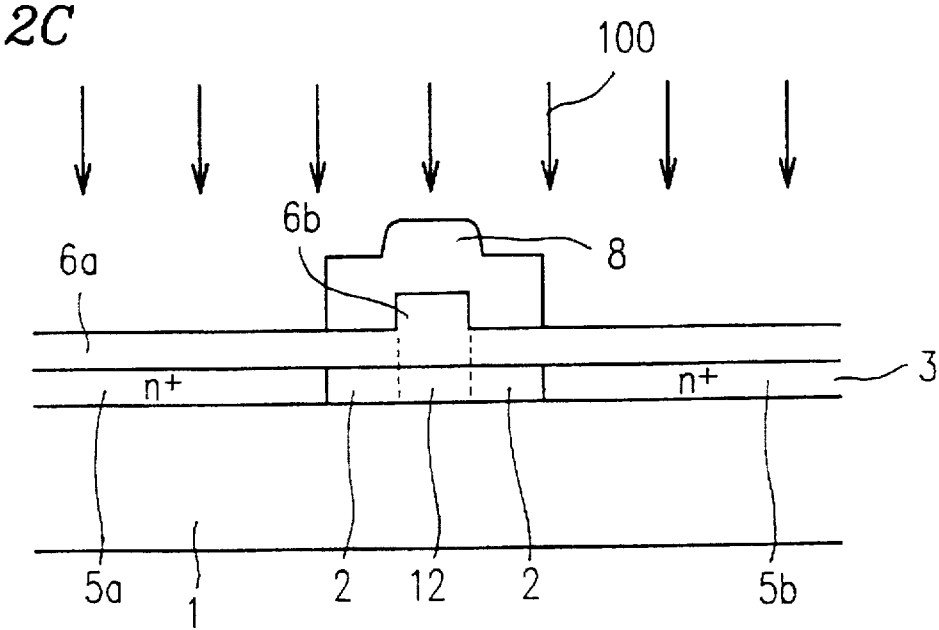

Next, after the gate electrode 8 extending along the first direction is formed, as shown in FIG. 2C, impurity ions 100 are implanted into the semiconductor layer 3 using the gate electrode 8 as a mask, thereby forming the source region 5a and drain region 5b in the semiconductor layer 3 in self-alignment with the gate electrode 8. At this time, channel regions 2 and 12 are formed in the portion of the semiconductor layer 3 vertically beneath the gate electrode 8 since the impurities are not implanted in that portion. In this embodiment, phosphorous ions are used as the impurity ions 100, and implanted at an acceleration energy of 80 to 100 keV with an implant dose of $2 \times 10^{15}$ ions/cm$^2$. After implantation, the impurity ions are activated to reduce the resistance, thus forming the source region 5a and drain region 5b. The activation of impurity ions can be accomplished by furnace annealing, lamp annealing, laser annealing, or by the self activation method hereinafter described.

In the self activation method, a source gas with increased hydrogen concentration is implanted into the source/drain regions using the ion doping method described in U.S. Pat. No. 5,403,756 issued on Apr. 4, 1995 to Yoshinouchi et al. entitled "Method of producing a polycrystalline semiconductor film without annealing, for thin film transistor". For example, using a $PH_3$ gas with a hydrogen concentration of 95% as the source gas, a plasma is generated, and hydrogen ions are implanted simultaneously with phosphorous ions, upon which the impurity ions are activated by being assisted by the hydrogen ions. Since this eliminates the need for thermal annealing to activate the impurity ions, the source/drain regions can be formed by a low temperature process at 300° C. or less, permitting the use of a relatively low-melting metal for the gate electrode material. For example, aluminum, as a low-melting metal, can be used, and in the case, since aluminum is a low-resistance material, low-resistance interconnections can be achieved.

Figure 3A:
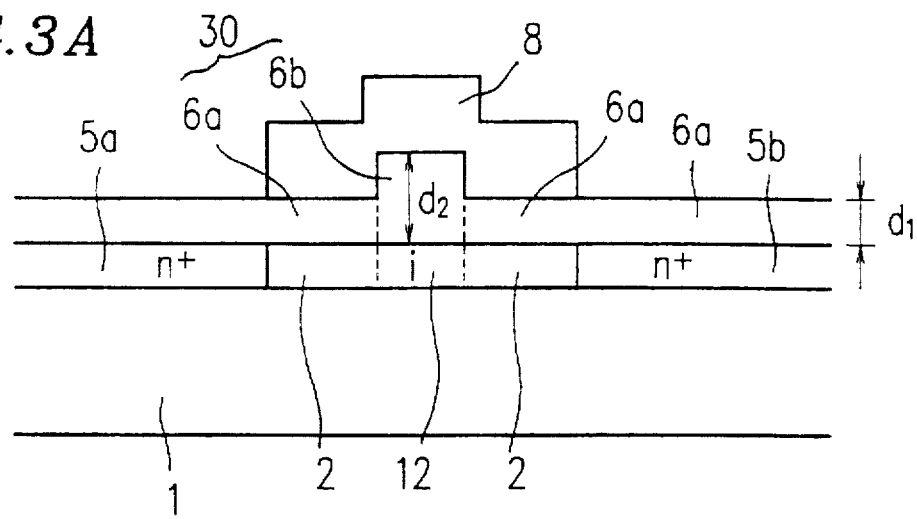
FIGS. 3A to 3C are cross-sectional views for explaining the operating principle of the TFT according to the first embodiment of the present invention.
Figure 3B:
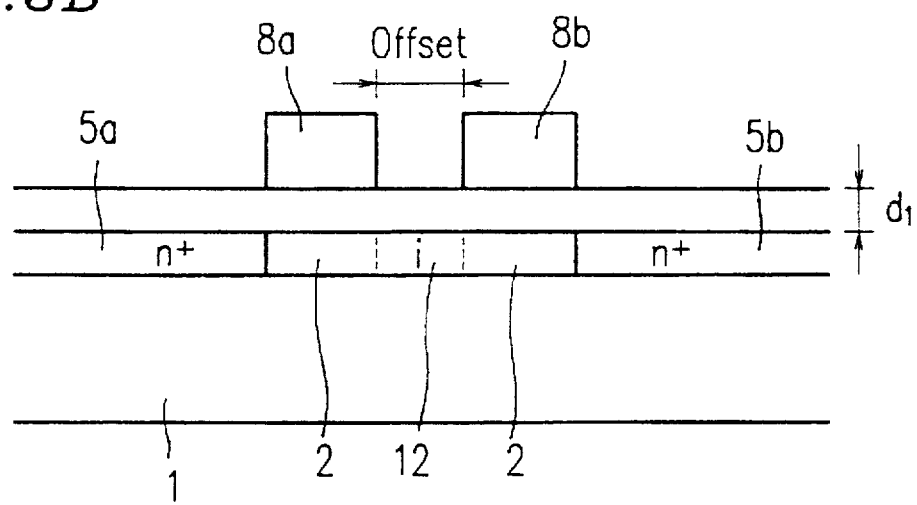
Figure 3C:
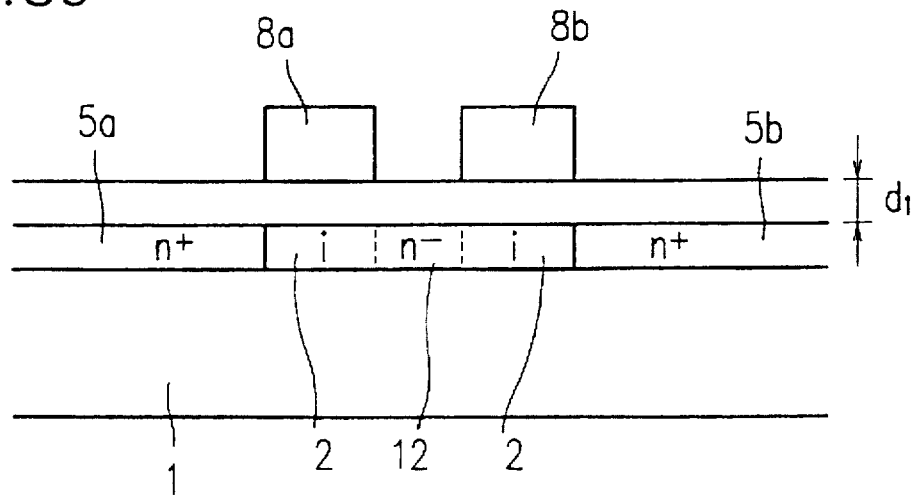

The operating principle of the thus fabricated TFT of this embodiment will be explained with reference to FIG. 3A to 3C. In FIG. 3A to 3C, the film thickness of the first portion 6a is designated as d1, and that of the second portion 6b as d2.

When d2>>d1, the TFT of the invention shown in FIG. 3A exhibits behavior essentially equivalent to the TFT of FIG. 3B, since the portion of the gate electrode 8 directly above the second portion 6b less acts as a gate electrode than those of the gate electrode 8 directly above the first portions 6a.

The TFT of FIG. 3B is a dual-gate TFT having two gate electrodes 8a and 8b. In the TFT Shown in FIG. 3B, an electric field applied between the source region 5a and the drain region 5b is split, thereby reducing the electric field between the source region 5a and the drain region 5b. Furthermore, since the channel region 12 is interposed between the channel regions 2 which act as actual channels for TFTs having gate electrodes 8a and 8b, respectively, and not doped with impurities, the channel region 12 acts as an offset region for a TFT having the gate electrode 8a. This prevents the electric field from increasing at the end portion of the channel 12. The combination of the effects obtained by the dual-gate structure and offset-gate structure therefore reduces the off current in the reverse bias conditions, and a TFT having little characteristic degradation can be obtained.

Furthermore, in the case where the source region 5a and the drain region 5b are interchanged in operation, the offset region is always located between the channel regions 2, so that the electric field is reduced at the end portion of the channel region 12 which acts as a drain region of either one of the TFTs having the gate electrode 8a and 8b, respectively. In particular, for an active-matrix liquid-crystal display apparatus, since pixel TFTs need to act as the source region or the drain region based on the signal state, this structure that reduce the electric field at the end portion of a drain in one or the other of the TFTs, as described above, is very desirable.

When d2>d1, the TFT of the invention shown in FIG. 3A exhibits behavior essentially equivalent to the TFT of FIG. 3C, since the portion of the gate electrode 8 directly above the second portion 6b acts as a gate electrode to some extent.

The TFT of FIG. 3C is a dual-gate structured TFT having two gates 8a and 8b. In the TFT shown in FIG. 3C, an electric field applied between the source region 5a and the drain region 5b is split, thereby reducing the electric field. In addition, the channel region 12 vertically beneath the second portion 6b is not doped with impurities, but an actual channel tends to be substantially induced while an gate voltage for an onstate is applied to the gate electrode 8. Therefore, the channel region 12 exhibits behavior similar to a lightly doped region employed in an LDD structure. As a result, the channel region 12 acts as a pseudo-LDD region formed in the drain of the TFT having the gate 8a, thereby reducing the electric field at the end portion of the drain.

Accordingly, in the case, the combination of the effects obtained by the dual-gate structure and the pseudo-LDD structure also reduces the off current in the reverse bias conditions, and a TFT having little characteristic degradation can be obtained. Furthermore, in the case where the source region 5a and the drain region 5b are interchanged in operation, the offset region is always located between the channel regions 2, so that the electric field is reduced at the end portion of the channel region 12 which acts as a drain region of either one of the TFTs having the gate electrode 8a and 8b, respectively. In particular, for an active-matrix liquid-crystal display apparatus, since pixel TFTs need to act as the source region or the drain region based on the signal state, this structure that reduce the electric field at the end portion of a drain in one or the other of the TFTs, as described above, is very desirable. Furthermore, in this structure, the on current can be increased as compared to the structure with d2 >>dl.

As described above, in the TFT of this embodiment, the formation of the second portion 6b in the gate insulating film serves to reduce the electric field and the off current in the reverse-bias state, and a TFT having little characteristic degradation can be obtained. Furthermore, the obtained effect of the invention remains substantially unchanged as long as the second portion 6b is displaced beneath the gate electrode 8. Thus, the second portion 6b may be offset form the center between the source region 5a and the drain region 5b. This allows a large margin of alignment error in the fabrication of TFTs.

Figure 4A:
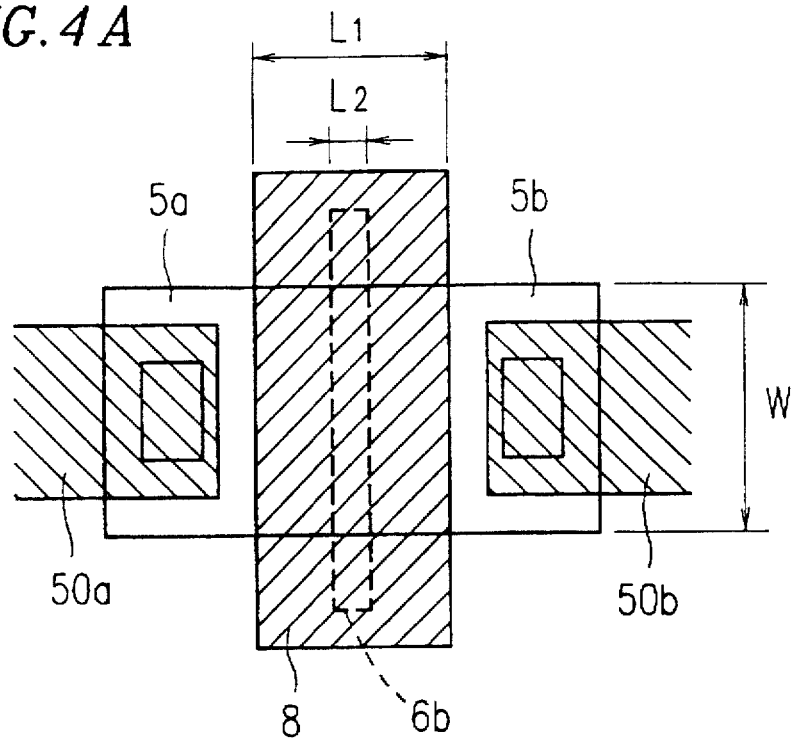
FIG. 4A is a schematic plan view of the TFT according to the first embodiment of the present invention.
Figure 4B:
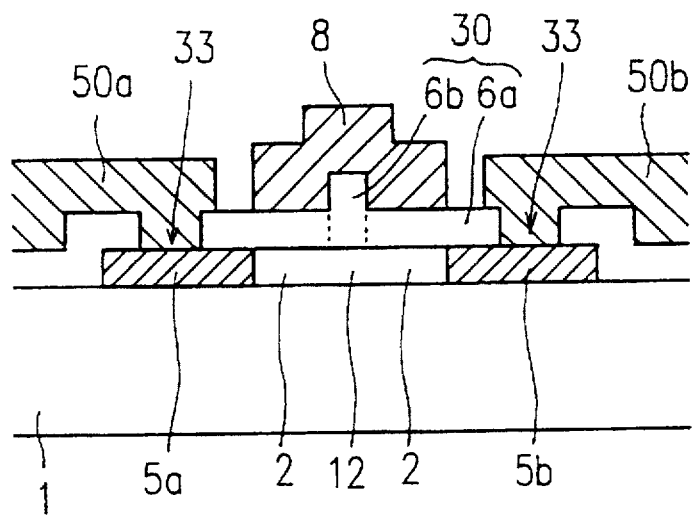
FIG. 4B is a cross-sectional view of the TFT shown in FIG. 4A.

The TFT may also be formed as shown in FIGS. 4A and 4B. In the TFT shown in FIGS. 4A and 4B, contact holes 33 are provided in the first portions 6a of the gate insulating film 30 for connecting the source region 5a and the drain region 5b to a source electrode 50a and a drain electrode 50b, respectively. In the illustrated TFT, L1=10 μm, L2=4 μm, and W=15 μm, but these dimensions may be varied according to the purpose of use. For example, to increase the on current, the difference between L1 and L2 (L1−L2) is reduced, or W is increased.

(Embodiment 2)

Figure 5:
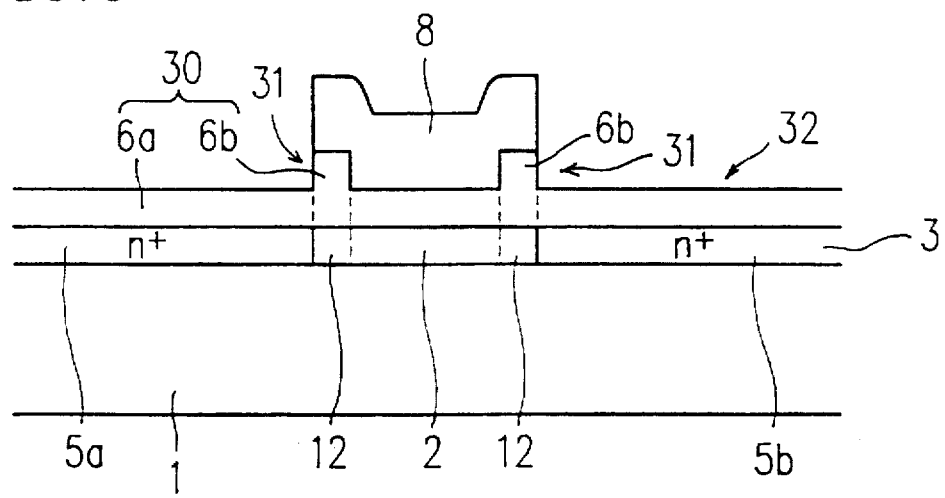
FIG. 5 is a schematic cross-sectional view of a TFT according to a second embodiment of the present invention.

FIG. 5 shows a TFT according to a second embodiment of the invention. In the TFT shown in FIG. 5, a semiconductor layer 3 is formed on a substrate 1, and a gate insulating film 30 is formed on the semiconductor layer 3. A gate electrode 8 is further formed on the gate insulating film 30. The gate insulating film 30 includes first portions 6a having a first thickness and two second portions 6b having a second thickness. The second portions 6b are located under the gate electrode 8 such that one of the side faces of the one second portion 6b is aligned with one side face of the gate electrode 8 and one of the side faces of the other second portion 6b is aligned with the other side face of the gate electrode 8. The second thickness is 1.2 to 8.0 times as great as the first thickness.

The semiconductor layer 3 includes channel regions 12 and 2, a source region 5a, and a drain region 5b. The channel regions 12 and 2 are positioned vertically beneath the gate electrode 8, the channel regions 12 are also positioned vertically beneath the second portions 6b. The channel region 2 beneath the gate electrode 8 is interposed between the channel regions 12 which are positioned beneath the second portions 6b. The channel regions 12 and 2 are interposed between the source region 5a and the drain region 5b which are heavily doped with impurities.

It is also explained that the gate insulating film 30 has a insulating film 32 having two ridges 31 thereon. The ridges 31 are positioned beneath the gate electrode 8. One of the side faces of the one ridge 31 is aligned with one of the opposing side face of the gate electrode 8 and one of the side faces of the other ridge 31 is aligned with the other side face of the gate electrode 8. The ridges 31 extend along the gate electrode 8, i.e., along the direction perpendicular to a channel length.

The TFT shown in FIG. 5 can be fabricated in the same manner as in the first embodiment, except that the second portions 6b and 6b are formed adjacent to a source end and a drain end, respectively.

In the TFT of this embodiment, since the second portions 6b are formed in the gate insulating film 30, the channel regions 12 beneath the second portions 6b act as an offset portion or a lightly doped drain region, as is explained in the first embodiment. Therefore, this structure also is effective in reducing the electric field and the off current in the reverse bias state, and realizes the fabrication of a TFT having little characteristic degradation.

(Embodiment 3)

Figure 6:
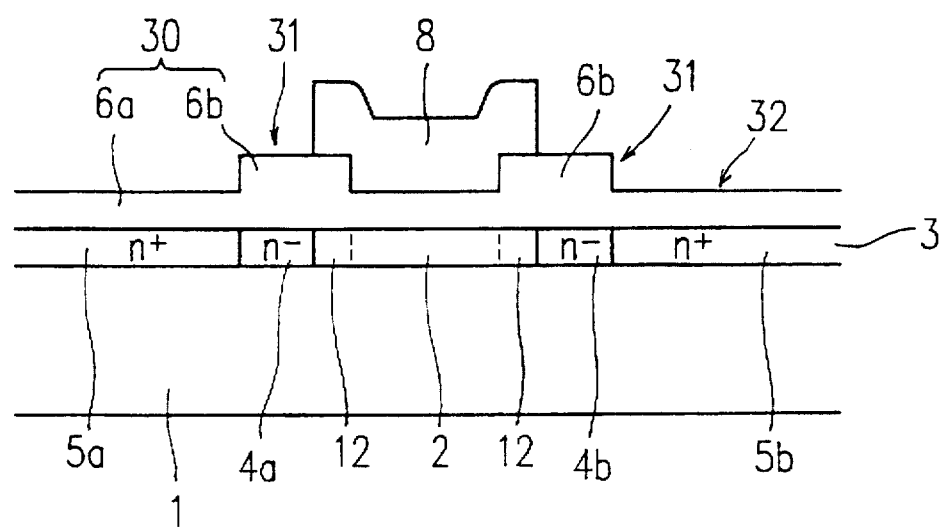
FIG. 6 is a schematic cross-sectional view of a TFT according to a third embodiment of the present invention.

FIG. 6 shows a TFT according to a third embodiment of the invention. In the TFT shown in FIG. 6, a semiconductor layer 3 is formed on a substrate 1, and a gate insulating film 30 is formed on the semiconductor layer 3. A gate electrode 8 is further formed on the gate insulating film 30. The gate insulating film 30 includes first portions 6a having a first thickness and two second portions 6b having a second thickness. The gate electrode 8 overlaps respective parts of the two second portions 6b such that the opposing side faces of the gate electrode 8 are disposed above the two second portions 6b, respectively, along the direction in which the second portions 6b are extending. The second thickness is 1.2 to 8.0 times as great as the first thickness.

The semiconductor layer 3 includes channel regions 12 and 2, a source region 5a, a drain region 5b, and lightly doped region 4a and 4b. The channel regions 12 and 2 are positioned vertically beneath the gate electrode 8, the channel regions 12 are also positioned vertically beneath the second portions 6b. The channel region 2 beneath the gate electrode 8 is interposed between the channel regions 12 which are positioned beneath the second portions 6b. The lightly doped regions 4a and 4b are also positioned vertically beneath the second portions 6b. The channel regions 12 and 2 are interposed between the lightly doped regions 4a and 4b, and the lightly doped regions 4a and 4b are, in turn, interposed between the source region 5a and the drain region 5b which are heavily doped with impurities.

It is also explained that the gate insulating film 30 has a insulating film 32 having two ridges 31 thereon and that portions of the ridges 31 are positioned beneath the gate electrode 8. The opposing side faces of the gate electrode 8 are disposed above the two ridges 31, respectively, along the direction in which the ridges 31 are extending.

Figure 7A:
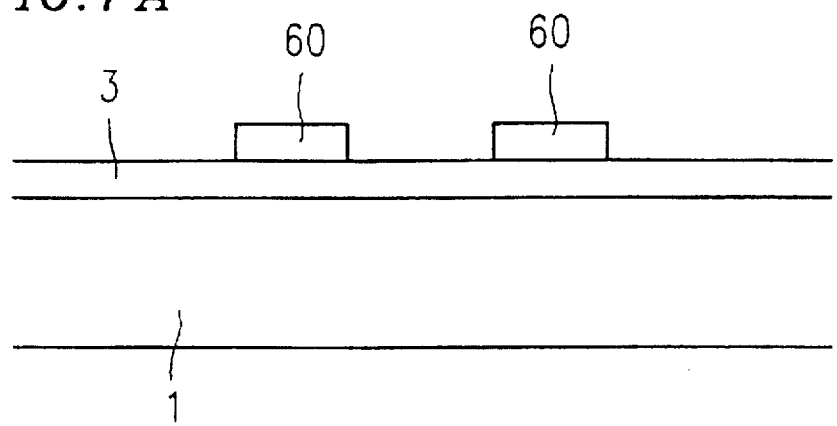
FIGS. 7A to 7C are cross-sectional views illustrating a fabrication process sequence for the TFT according to the third embodiment of the present invention.
Figure 7B:
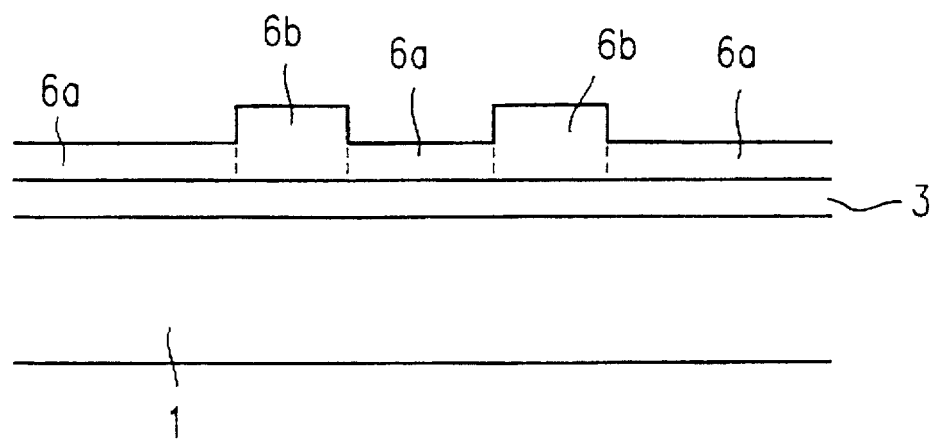
Figure 7C:
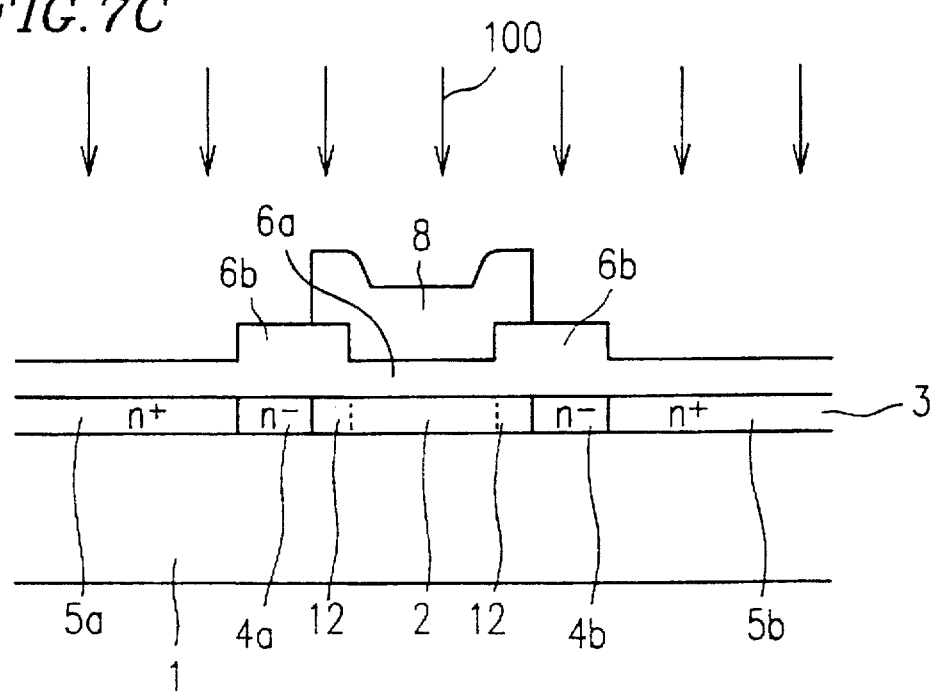

The TFT can be fabricated in accordance with the fabrication process sequence shown in FIG. 7A to 7C.

First, as shown in FIG. 7A, the semiconductor layer 3 is formed over the substrate 1. The substrate 1 is formed, for example, from a quartz substrate, a glass substrate, or a glass substrate coated with an insulating film. The semiconductor layer 3 is formed, for example, from a semiconductor film such as amorphous silicon, microcrystalline silicon, or polycrystalline silicon. When the substrate 1 is formed from single-crystalline silicon, it is not necessary to form the semiconductor layer 3, since the single-crystalline silicon substrate itself can be used as the semiconductor layer. Furthermore, the semiconductor layer may be formed from any of the above materials with containing germanium, nickel, phosphorus, boron, arsenic, etc. contained therein.

The semiconductor layer 3 can be formed by depositing a film of thickness 10 nm to 200 nm using a film deposition process such as plasma CVD or LPCVD. For example, a polycrystalline silicon film can be deposited directly on the substrate by LPCVD with the substrate held at temperatures 580° to 650° C. Further, if an amorphous silicon film deposited by LPCVD, at substrate temperatures of 400° to 600° C., is annealed in vacuum or in an inert gas atmosphere at 500° to 650° C. for 6 to 48 hours, a polycrystalline silicon film with increased quality is obtained. An amorphous silicon film can also be formed by plasma CVD, using $SiH_4$ or $Si_2H_6$ as the source gas. Lamp annealing or laser annealing may be used to anneal the amorphous silicon film.

Next, an insulating film is deposited over the semiconductor layer 3, and etching is performed to form insulting film islands 60 extending along a first direction. The insulating film can be deposited by sputtering, atmospheric-pressure CVD, LPCVD, plasma CVD, remote plasma CVD, etc. In this embodiment, a $SiO_2$ film of thickness 30 to 150 nm was formed. Alternatively, the insulating film may be formed from silicon nitride, tantalum oxide, aluminum oxide, or the like.

As shown in FIG. 7B, an insulating film is deposited over the insulating film islands 60, to form an insulating film having the first portion 6a and the second portions 6b having a greater film thickness than the first portion 6a. This insulating film can be formed by a deposition process such as sputtering, atmospheric-pressure CVD, LPCVD, plasma CVD, or remote plasma CVD. In this embodiment, a $SiO_2$ film of thickness 60 to 150 nm was formed. A combination of $SiH_4$ gas and $O_2$ gas, or TEOS (tetra-ethyl-ortho-silicate, $Si(OC_2H_5)_4$) gas and $O_2$ gas, etc. is used as the source gas. The insulating film may also be formed from silicon nitride, tantalum oxide, aluminum oxide, or the like. In the above description, the second portions are formed as two-layered insulating films, but alternatively, the gate insulating film having the first portion 6a and second portions 6b may be formed by first forming an insulating film having the second thickness where the gate insulating film is to be formed, and then reducing the thickness of the insulating film by photolithography and etching in a region where the first portion is to be formed.

After the gate electrode 8 is formed, as shown in FIG. 7C, impurity ions 100 are implanted in the semiconductor layer 3 using the gate electrode as a mask thereby forming the source region 5a and drain region 5b in the semiconductor layer 3 in self alignment with the gate electrode 8. At this time, channel regions 2 and 12 are formed in the portion of the semiconductor layer vertically beneath the gate electrode 8 since the impurities are not implanted in that portion. Further, lightly doped regions 4a and 4b are formed below the areas of the second portions 6b and 6b which are not disposed beneath the gate electrode 8, since impurities are difficult to implant in these areas as compared to the first portion 6a. In this embodiment, phosphorous ions were used as the impurity ions 100, and an implant dose of $2\times10^{15}$ ions/cm² was implanted at an energy of 80 to 100 keV. After implantation, the impurity ions were activated to reduce the resistance, thus forming the source region and drain region. The activation of impurity ions can be accomplished by furnace annealing, lamp annealing, laser annealing, or by the self activation method earlier described.

In the TFT of this embodiment, since the second portions 6b are formed in the gate insulating film 30, the channel regions 12 beneath the second portions 6b act as an offset portion or a lightly doped drain region, as is explained in the first embodiment. Therefore, this structure also is effective in reducing the electric field and the off current in the reverse-biased state, and realizes the fabrication of a TFT having little characteristic degradation. Furthermore, when impurity ions are implanted into the semiconductor layer 3 so as to form the source region 5a and drain region 5b therein, lightly doped regions 4a and 4b having a higher resistance than the source region 5a and drain region 5b are formed. This serves to further reduce the electric field at the end potion of the source and drain regions and the off current in the reverse bias conditions, realizing the fabrication of a TFT having little characteristic degradation.

(Embodiment 4)

Figure 8:
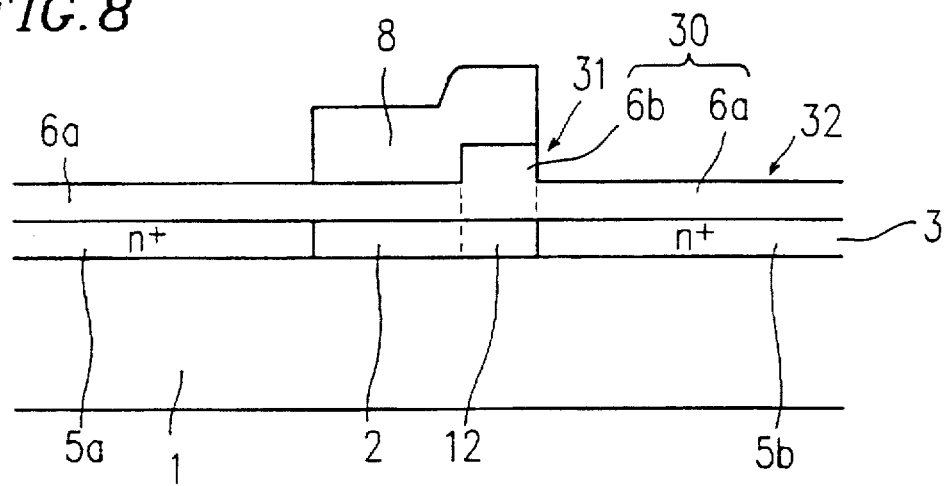
FIG. 8 is a schematic cross-sectional view of a TFT according to a fourth embodiment of the present invention.

FIG. 8 shows a TFT according to a fourth embodiment of the invention. In the TFT shown in FIG. 8, a semiconductor layer 3 is formed on a substrate 1, and a gate insulating film 30 is formed on the semiconductor layer 3. A gate electrode 8 is further formed on the gate insulating film 30, the gate insulating film 30 includes first portions 6a having a first thickness and a second portion 6b having a second thickness. The second portion 6b is located under the gate electrode 8 such that a side face of the second portion 6b is aligned with a side face of the gate electrode 8 which defines the border between a drain region 5b and a channel region 12. The second thickness is 1.2 to 8.0 times as great as the first thickness.

The semiconductor layer 3 includes channel regions 12 and 2, a source region 5a, and the drain region 5b. The channel regions 12 and 2 are positioned vertically beneath the gate electrode 8, the channel regions 12 is also positioned vertically beneath the second portions 6b. The channel regions 12 and 2 are interposed between the source region 5a and the drain region 5b which are heavily doped with impurities.

It is also explained that the gate insulating film 30 has a insulating film 32 having a ridge 31 thereon. The ridge 31 is positioned beneath the gate electrode 8. A side face of the ridge 31 is aligned with a side face of the gate electrode 8 which defines the border between a drain region 5b and a channel region 12. The ridge 31 extends along the gate electrode 8, i.e., along the direction perpendicular to a channel length.

The TFT can be fabricated in the same manner as in the first embodiment, except that the second portion 6b is formed adjacent to the drain end.

In the TFT of this embodiment, since the second portion 6b is formed in the gate insulating film 30, the channel region 12 beneath the second portion 6b acts as an offset portion or a lightly doped drain region, as is explained in the first embodiment. Therefore, this structure also is effective in reducing the electric field and the off current in the reverse-biased state, and realizes the fabrication of a TFT having little characteristic degradation. Since the second portion 6b is located only towards the drain region 5b where the field strength increases, the TFT of this embodiment provides a larger on current than the TFT of the second embodiment in which the second portions are provided towards both the source and drain regions. The TFT of this embodiment is suitably applied to a device in which source and drain regions of a TFT are not interchanged during the operation.

(Embodiment 5)

Figure 9:
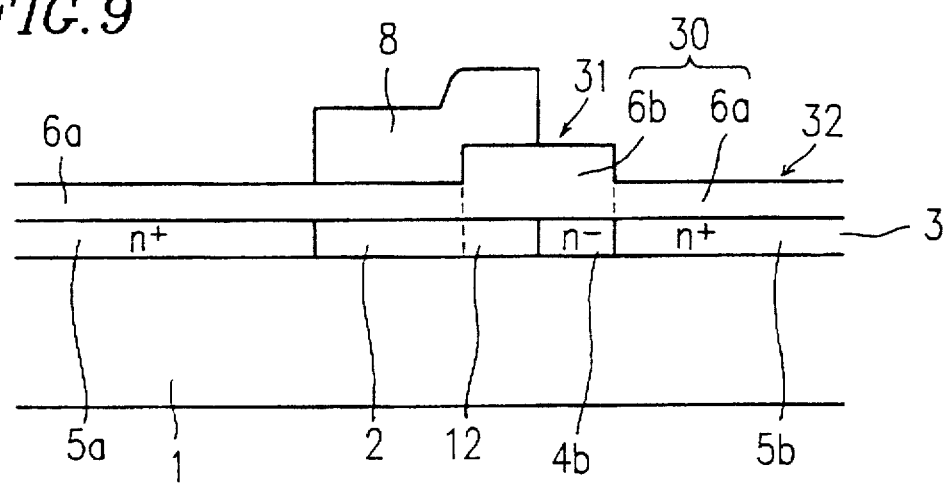
FIG. 9 is a schematic cross-sectional view of a TFT according to a fifth embodiment of the present invention.

FIG. 9 shows a TFT according to a fifth embodiment of the invention. In the TFT shown in FIG. 9, a semiconductor layer 3 is formed on a substrate 1, and a gate insulating film 30 is formed on the semiconductor layer 3. A gate electrode 8 is further formed on the gate insulating film 30. The gate insulating film 30 includes first portions 6a having a first thickness and a second portion 6b having a second thickness. The gate electrode 8 overlaps a portion of the second portion 6b such that the side face of the gate electrode 8 which defines the border between a drain region 5b and a channel region 12, are disposed above the second portion 6b along the direction in which the second portion 6b are extending. The second thickness is 1.2 to 8.0 times as great as the first thickness.

The semiconductor layer 3 includes channel regions 12 and 2, a source region 5a, a drain region 5b, and a lightly doped region 4b. The channel regions 12 and 2 are positioned vertically beneath the gate electrode 8, the channel region 12 is also positioned vertically beneath the second portion 6b. The lightly doped region 4b is positioned vertically beneath the second portion 6b. The channel regions 12 and 2 are interposed between the lightly doped region 4b and the source region 5a, and the lightly doped region 4b is adjacent to the drain region 5b.

It is also explained that the gate insulating film 30 has a insulating film 32 having a ridge 31 thereon. A portion of the ridge 31 is positioned beneath the gate electrode 8. The side face of the gate electrode 8 which defines the border between a drain region 5b and a channel region 12 is disposed above the ridge 31 along the direction in which the ridge 31 extends.

This TFT can be fabricated in the same manner as in the third embodiment, except that the second portion 6b is formed adjacent to the drain end.

In the TFT of this embodiment, since the second portion 6b is formed in the gate insulating film 30, the channel region 12 beneath the second portion 6b acts as an offset portion or a lightly doped drain region, as is explained in the first embodiment. Therefore, this structure also is effective in reducing the electric field and the off current in the reverse-biased state, and realizes the fabrication of a TFT having little characteristic degradation. Furthermore, when impurity ions are implanted into the semiconductor layer 3 so as to form the source region 5a and the drain region 5b therein, the lightly doped region 4b having a higher resistance than the source region 5a and the drain region 5b is formed. This serves to further reduce the electric field at the end potion of the source and drain regions and the off current in the reverse-biased state, realizing the fabrication of a TFT having little characteristic degradation. Since the second portion 6b is located only towards the drain region 5b where the field strength increases, the TFT of this embodiment provides a larger on current than the TFT of the second embodiment in which the second portions are provided towards both the source and drain regions. The TFT of this embodiment is suitably applied to a device in which source and drain regions of a TFT are not interchanged during the operation.

(Embodiment 6)

Figure 10:
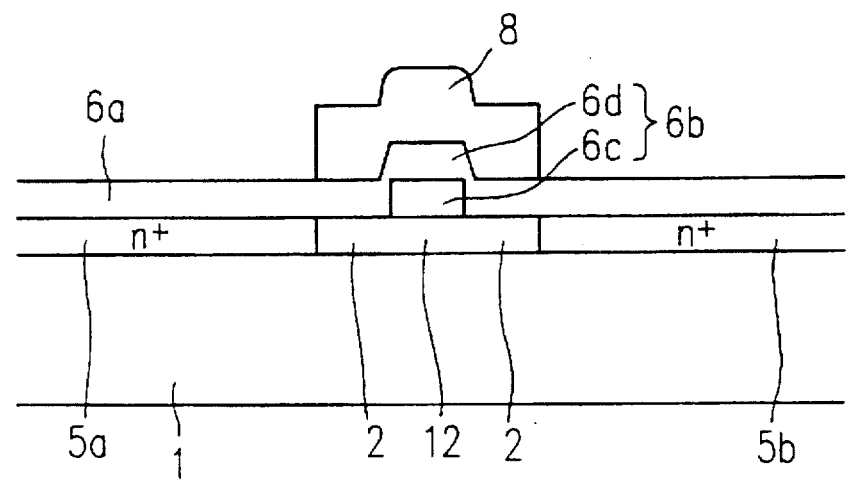
FIG. 10 is a schematic cross-sectional view of a TFT according to a sixth embodiment of the present invention.

FIG. 10 shows a schematic cross-sectional view of a TFT according to a sixth embodiment of the invention. The TFT of this embodiment is different from the TFT explained in Embodiment 1 in that the gate insulating film 30 has a multilayered structure.

The gate insulating film 30 has first portions 6a and a second potion 6b, as is explained in Embodiment 1, but the second portion 6b is constructed in a multilayered structure consisting of an insulating film 6d having the first thickness and an insulating film 6c having a film thickness 0.2 to 7.0 times the first thickness. The insulating films 6c and 6d may be formed from the same material or from different materials, and may be deposited in any order. This TFT can be fabricated by the method shown in FIG. 2, as in the first embodiment.

In the TFT of this embodiment, the formation of the second portion 6b in the gate insulating film serves to reduce the electric field and the off current in the reverse-bias state, and a TFT having little characteristic degradation can be obtained. Furthermore, the obtained effect of the invention remains substantially unchanged as long as the second portion 6b is displaced beneath the gate electrode 8. Thus, the second portion 6b may be offset form the center between the source region 5a and the drain region 5b. This allows a large margin of alignment error in the fabrication of TFTs.

Figure 11:
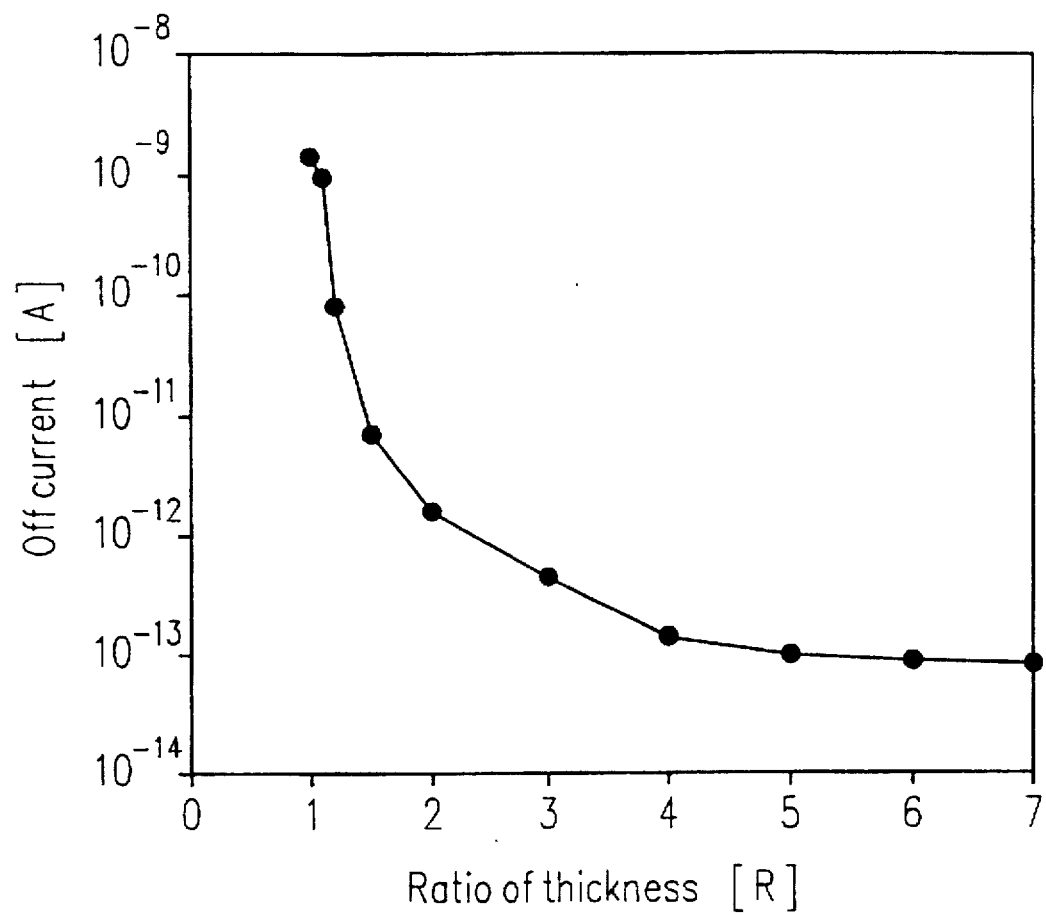
FIG. 11 is a graph plotting a reverse bias voltage measured while varying a film thickness ratio R, the ratio of the thickness of a second portion 6b to that of a first portion 6a, in the TFT of the present invention.

FIG. 11 is a graph illustrating the relationship between the off current under reverse bias conditions and ratio of the second thickness to the first thickness in the N-channel TFT according to the Embodiment 1. For the off current, the drain current $I_D$ is measured when the drain/source voltage $V_{DS}$= 14 V and the gate voltage $V_G$=−3.5 V. The size of the transistor used was L1/W=10 µm/10 µm, and the length L2 along the channel direction of the second portion 6b is set at 4 µm. No significant change was caused in the off current when L2 is in the range 1 to 6 µm.

As can be seen from the graph, since the off currents are about $10^{-9}, 10^{-10}$, and $10^{-11}$ A at R=1, R=1.2, and R=1.5, respectively, an effect of about an order of magnitude is observed at R=1.2, and a dramatic effect of two or more orders of magnitude is observed at R=1.5. The off current decreases monotonically until about R=4, and the effect reaches saturation at R≧5. It is therefore desirable that the thickness of the second portion 6b be at least 1.2 times that of the first portion 6a. For R≧5, the off current is saturated but the effect is obtained. However, R>8 is not desirable, since the second portion 6b becomes excessively thick, reducing the fabrication efficiency and making step coverage difficult for the gate electrode 8 formed above the second portion. For example, to produce a gate insulating film with good dielectric strength and with good yield, the first-thickness film must be formed to a thickness of about 50 to 150 nm. At R=8, however, the second film thickness is 400 to 1200 nm; this reduces the fabrication efficiency and the throughput decreases. Furthermore, when the second film thickness is 400 to 1200 nm, step coverage becomes difficult for the gate electrode 8 formed thereabove, and it becomes necessary to form the gate electrode to a greater thickness than the second film thickness. Accordingly, to obtain a substantial effect by the TFT of the invention, 1.2≦R≦8.0 is desirable. Further, according to FIG. 11, since the effect is obtained most effectively when R is in the range of 1.5 to 4.0, 1.5≦R≦4.0 is particularly preferable. At this time, the decrease in the on current of the TFT was minimal and no problem occurred in operation.

(Embodiment 7)

This embodiment is concerned with a liquid-crystal display apparatus in which the TFT of the present invention is used at each pixel site.

Figure 12:
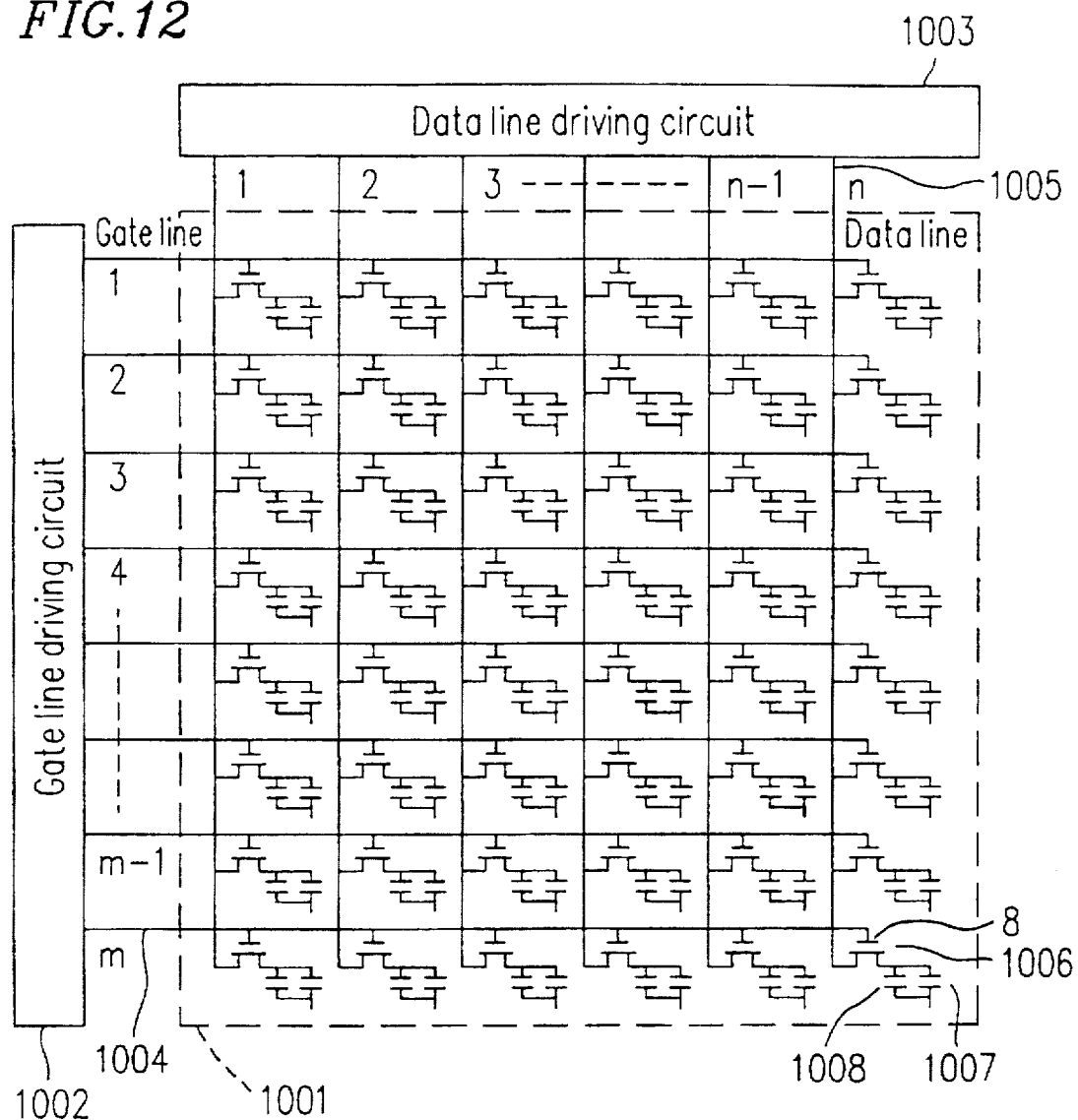
FIG. 12 is a diagram showing the structure of a liquid-crystal display apparatus according to one embodiment of the present invention.
Figure 13:
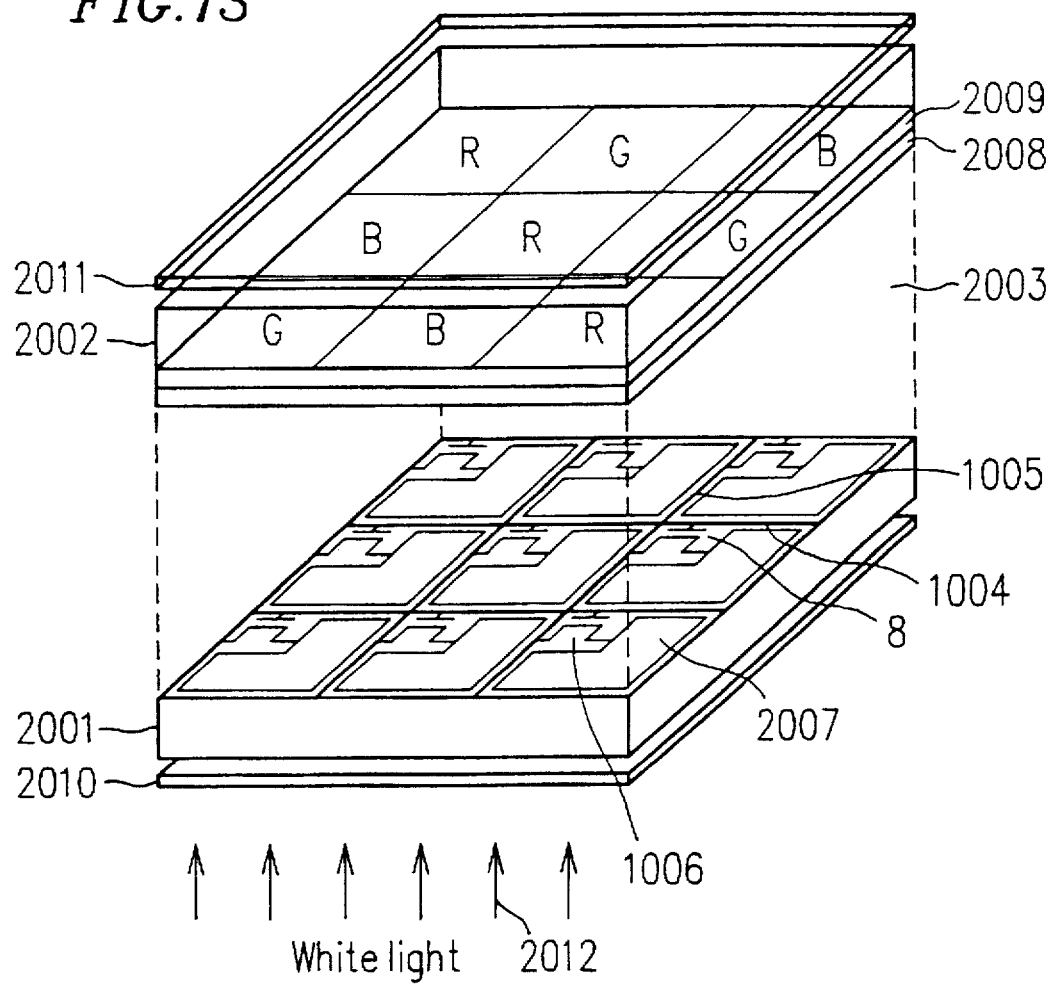
FIG. 13 is a perspective view of the liquid-crystal display apparatus according to the one embodiment of the present invention.
Figure 14:
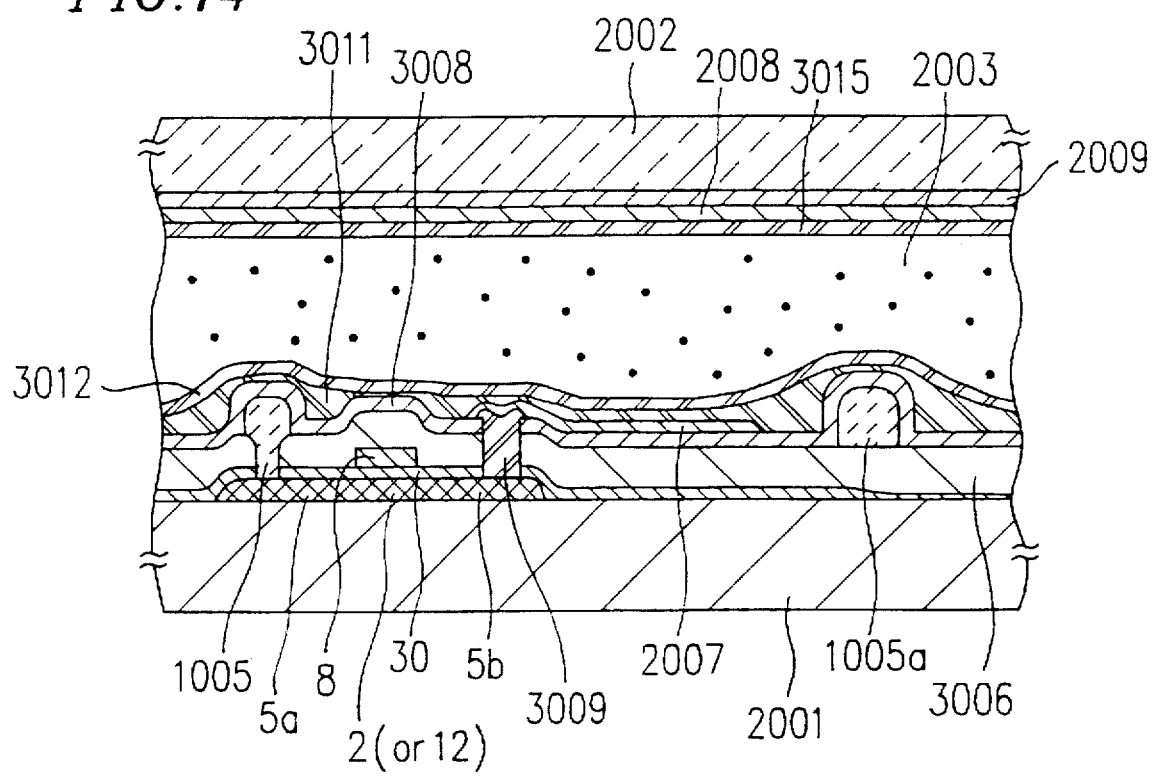
FIG. 14 is a cross-sectional view of the liquid-crystal display apparatus according to the one embodiment of the present invention.
Figure 15:
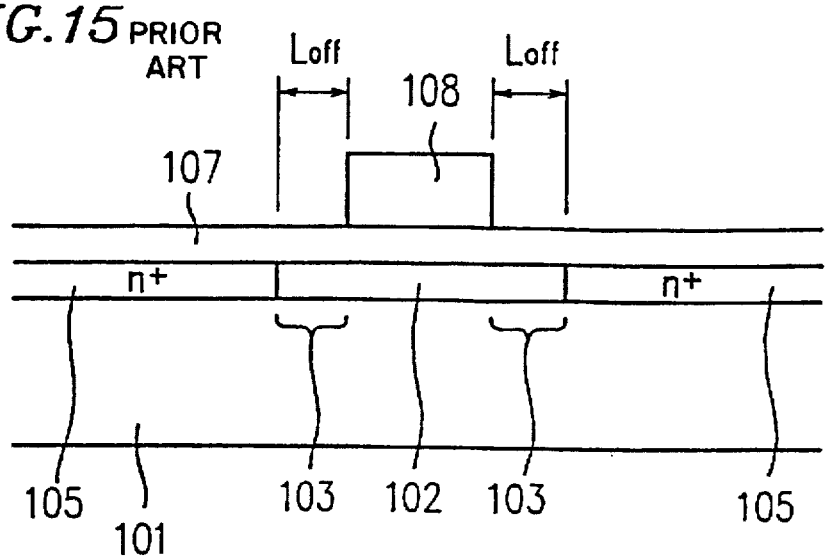
FIG. 15 is a cross-sectional view of a conventional TFT of an offset-gate structure.
Figure 16:
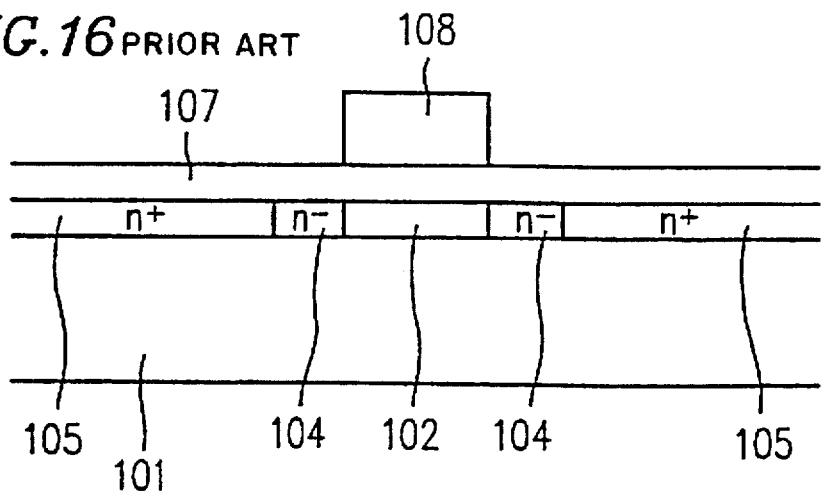
FIG. 16 is a cross-sectional view of a conventional TFT of an LDD structure.
Figure 17:
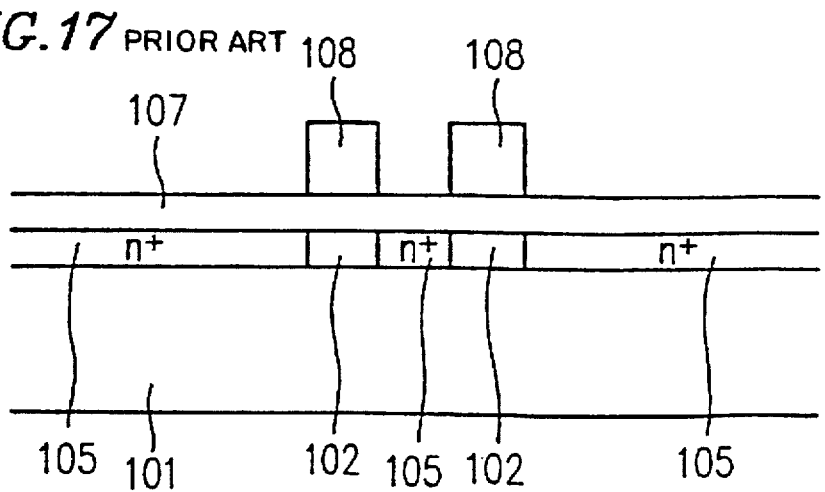
FIG. 17 is a cross-sectional view of a conventional TFT of a dual-gate structure.

FIG. 12 is a diagram showing the structure of the liquid-crystal display of this embodiment, FIG. 13 is a perspective view of a display section, and FIG. 14 is a cross-sectional view of the display section. In the liquid-crystal display, as shown in FIG. 12, gate lines 1004 and data lines 1005 are formed intersecting each other in the display section 1001, and near each intersection a TFT 1006 is formed which is connected to a liquid-crystal section 1007 and an auxiliary capacitor 1008. A gate line drive circuit 1002 and a data line drive circuit 1003 are provided on the periphery of the display section 1001 and are connected to the gate lines 1004 and data lines 1005, respectively.

As shown in FIG. 13, the TFTs 1006, scanning lines 1004, data lines 1005, and pixel electrodes 2007 are formed on a substrate 2001, and the gate electrode 8 of each TFT 1006 is connected to the adjoining gate line 1004, the source region 5a (see FIG. 14) to the data line 1005, and the drain region 5b (see FIG. 14) to the pixel electrode 2007 via a contact buffer metal 3009. Further, a liquid-crystal alignment film 3012 is formed on the substrate 2001 opposite which is disposed a counter substrate 2002 on which a common electrode 2008, a color filter 2009, and a second liquid-crystal alignment film 3015 are formed. A liquid-crystal layer 2003 is sandwiched between the two substrates to construct a liquid-crystal panel, each pixel (liquid-crystal section 1007) being located between the pixel electrode 2007 and the common electrode 2008.

Polarizing plates 2010 and 2011 are provided on both outer sides of the liquid-crystal panel. White light 2012 is projected from the side on the substrate 2001, and transmitted light is displayed. The TFT 1006 is formed from a semiconductor layer having the source region 5a, drain region 5b, and channel region 2, 12, and the gate electrode 8 formed thereabove across a gate insulating film. Formed on the gate electrode 8 is an interlevel insulating film 3006 on which the data line 1005 is formed. The data line 1005 is connected to the source region 5a via a contact hole opened through the interlevel insulating film 3006.

On the data line 1005 and auxiliary capacitance line 1005a is formed a second interlevel insulating film 3008 on which the contact buffer metal 3009 and pixel electrode 2007 are provided. The pixel electrode 2007 is connected to the drain region 5b via the contact buffer metal 3009 extending through a contact hole opened through the interlevel insulating film 3006 and second interlevel insulating film 3008. A portion where the auxiliary capacitance line 1005, the interlevel insulating film 3006, and pixel electrode 2007 overlap forms the auxiliary capacitor 1008. Thereabove is formed a protective film 3011 on which the liquid-crystal alignment film 3012 is formed. Any TFT according to Embodiments 1 to 6 may be employed as The TFT 1006, even though FIGS. 12 to 14 do not specifically show the structure of the TFT of the invention. As is explained in detail in Embodiment 1, a gate insulating film 30 which has a first potion 6a and a second portion 6b having a thickness 1.2 to 8.0 times as great as that of the first portion 6a.

The TFT 1006 has the structure capable of reducing the electric field and the off current under reverse bias conditions, as described in Embodiments 1 to 6. The TFT thus has little characteristic degradation. By using such TFTs for pixels in a liquid-crystal display, the ability to retain a displayed picture can be increased to improve the display quality, and a liquid-crystal display having high reliability can be provided.

Although the invention has been described with reference to the preferred embodiments, the invention is not limited to the illustrated embodiments, but various modification may be made in the invention. The above-described embodiments have each dealt with an N-channel TFT with the highly doped source and drain regions 5a and 5b as $n^+$ and the lightly doped region as $n^-$, but it will be appreciated that the embodiments can be applied equally to P-channel TFTs. Further, various insulating film materials, such as silicon oxide, silicon nitride, tantalum oxide, aluminum oxide, etc. can be used for the gate insulating film. The dimensions of the TFT, such as the first thickness and second thickness of the gate insulating film, the length L1 of the first portion, the length L2 of the second portion, the width W of the semiconductor layer, etc. can be varied as necessary according to the purpose of use. One or two second portions were formed between the gate electrode and semiconductor layer, but three or more second portions may be formed.

As is apparent from the above description, according to the invention, since the gate insulating film has a first portion and a second portion respectively formed to different thicknesses on the portion of the semiconductor layer sandwiched by the source and drain regions, a region relatively insensitive to an applied gate voltage is formed midway through the channel. With the presence of this region, the voltage applied between the source and drain is prevented from concentrating at the drain end but is divided, as a result of which the off current in the reverse bias condition is reduced and the intensity of the electric field at end portion of the drain is reduced. Therefore, an abruptly increasing portion of the electric field applied between the source and drain is eased, and a TFT having little characteristic degradation can be obtained. This effect is particularly enhanced when the second thickness is made 1.2 to 8.0 times the first thickness.

In forming the gate insulating film having two different thickness portions as described above, the fabrication is greatly facilitated if the second portion is constructed in a multilayer structure by first forming an insulating film of the first thickness and then forming thereon an insulating film having a thickness 0.2 to 7.0 times the first thickness in a region where the second portion is to be formed. In an alternative method, an insulating film of the second thickness is formed over the semiconductor layer, and etching is performed to reduce the thickness of the insulating film in a region where the first portion is to be formed. This also facilitates the fabrication. With these methods, it is possible to fabricate the TFT of this invention at a position where off current reduction is needed and the TFT of the prior art at a position where off current reduction is not needed, simultaneously on the same substrate.

When the TFT with the gate insulating film having two different thickness portions, as described above, is formed at each pixel site in a liquid-crystal display, the off current of the pixel TFT can be reduced, and the ability to retain a displayed image can be enhanced to improve the display quality. Furthermore, since this TFT has high reliability, the reliability of the liquid-crystal display can also be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin-film transistor comprising a semiconductor layer having a source region and a drain region, a gate insulating film formed on the semiconductor layer, and a gate electrode formed on the gate insulating film between the source region and the drain region and not extending over the source region and the drain region, wherein a portion of the gate insulating film disposed above a portion of the semiconductor layer and between the source region and the drain region includes a first portion with a first thickness and a second portion with a second thickness which is different from the first thickness, wherein the second portion forms a ridge of substantially uniform thickness above the portion of the semiconductor layer between the source region and the drain region and projecting from the first thickness level towards the gate electrode.

2. A thin-film transistor according to claim 1, wherein the second portion is 1.2 to 8.0 times as thick as the first portion.

3. A thin-film transistor according to claim 2, wherein the second portion is constructed in a multilayer structure consisting of an insulating film having the first thickness and an insulating film having a thickness 0.2 to 7.0 times the first thickness.

4. A liquid-crystal display apparatus comprising a plurality of thin-film transistors, each thin-film transistor including a source region and a drain region, a gate insulating film formed an the semiconductor layer, and a gate electrode formed on the gate insulating film between the source region and the drain region and not extending over the source region and the drain region, wherein a portion of the gate insulating film disposed above a portion of the semiconductor layer and between the source region and the drain region includes a first portion with a first thickness and a second portion with a second thickness which is different from the first thickness, wherein said second portion forms a ridge of insulating film of substantially uniform thickness above the portion of the semiconductor layer between the source region and the drain region and projecting above said first portion.

5. A thin-film transistor comprising:

a semiconductor layer having a source region and a drain region;

a gate insulating film formed on the semiconductor layer, the gate insulating film including an insulating film having at least one ridge formed in an upper surface of the gate insulating film, the ridge being of substantially uniform thickness and positioned above a portion of the semiconductor layer interposed between the source region and the drain region and extending along a first direction; and a gate electrode formed on the gate insulating film between the source region and the drain region and not extending over the source region and the drain region, said gate electrode extending along the first direction such that at least a portion of the ridge is covered with the gate electrode.

6. A thin-film transistor according to claim 5, wherein a thickness of the gate insulating film at the ridge is 1.2 to 8.0 times as great as that of a portion other than the ridge.

7. A thin-film transistor according to claim 5, wherein the gate insulating film has one ridge beneath a middle of the gate electrode.

8. A thin-film transistor according to claim 5, wherein the gate insulating film has one ridge beneath a side face of the gate electrode.

9. A thin-film transistor according to claim 8, wherein a side face of the ridge is aligned with the side face of the gate electrode.

10. A thin-film transistor according to claim 8, wherein the gate electrode leaves a portion of the ridge exposed.

11. A thin-film transistor according to claim 8, wherein the semiconductor layer includes a region doped with impurities and having a higher resistance than that of the drain region, and the region is disposed beneath a portion of the ridge that is not covered with the gate electrode.

12. A thin-film transistor according to claim 5, wherein the gate insulating film has two ridges beneath opposing side faces of the gate electrode, respectively.

13. A thin-film transistor according to claim 12, wherein side faces of the ridge is aligned with the corresponding side faces of the gate electrode, respectively.

14. A thin-film transistor according to claim 12, wherein the gate electrode leaves a portion of each ridge exposed.

15. A thin-film transistor according to claim 12, wherein the semiconductor layer includes two regions doped with impurities and having a higher resistance then that of the drain region, and each of the said two regions is disposed beneath a portion of the corresponding ridge that is not covered by the gate electrode.

* * * * *